United States Patent [19]
Yoshida et al.

[11] Patent Number: 6,005,660
[45] Date of Patent: Dec. 21, 1999

[54] DETECTION AND ANALYSIS OF A FINE FOREIGN MATTER ON A SAMPLE

[75] Inventors: Haruo Yoshida; Nobuo Miyamoto, both of Tokyo, Japan

[73] Assignee: Advantest Corporation, Tokyo, Japan

[21] Appl. No.: 09/086,311

[22] Filed: May 27, 1998

[30] Foreign Application Priority Data

Jun. 3, 1997 [JP] Japan ................................. 9-145251

[51] Int. Cl.[6] ........................... B23K 26/00; G01N 21/00
[52] U.S. Cl. ........................................ 356/237.3; 356/72
[58] Field of Search ................................. 356/72, 237.3, 356/237.4

[56] References Cited

U.S. PATENT DOCUMENTS

| | | | |
|---|---|---|---|
| 5,023,424 | 6/1991 | Vaught | 219/121.6 |
| 5,497,007 | 3/1996 | Vritsky et al. | 250/491.1 |
| 5,865,901 | 2/1999 | Yin et al. | 134/2 |

OTHER PUBLICATIONS

"Study of Semiconductors 26," VLSI Technology 11 The Industrial Research Society of Japan, pp. 167–168.

Kiyoshi Takahashi, et al., "The Foundation of A Light–Excited Process," The Industrial Research Society of Japan, (1994), pp. 220–227.

*Primary Examiner*—Richard A. Rosenberger
*Attorney, Agent, or Firm*—Oblon, Spivak, McClelland, Maier & Neustadt, P.C.

[57] ABSTRACT

A foreign matter processing apparatus is disclosed for detecting a foreign matter sticking to the surface of a sample such as a circuit board. In the sample processing apparatus of the present invention, a fine foreign matter sticking to a surface of a sample is detected, and the composition of the detected foreign matter is analyzed. Then, it is determined based on a result of the analysis and various data registered in advance whether or not it is required to remove the foreign matter, and the foreign matter, whose removal has been determined to be required, is removed from the surface of the sample. Accordingly, detection, analysis and removal of a foreign matter on the surface of a sample can be performed by a single apparatus.

38 Claims, 6 Drawing Sheets

DETECTION AND ANALYSIS OF A FINE FOREIGN MATTER ON A SAMPLE

BACKGROUND OF THE INVENTION

1. Field of the Invention

This invention relates to a sample processing apparatus for inspecting the surface of a sample, and more particularly to a sample processing apparatus and method by which it is inspected whether or not there is a foreign matter sticking to the surface of a sample such as a semiconductor wafer or a glass substrate.

2. Description of the Related Art

Conventionally, in a process of production of a semiconductor device, it must be inspected whether or not there is a foreign matter sticking to the surface of a semiconductor wafer determined as a circuit board, and variable surface inspection apparatus are available which realize such inspection.

A surface inspection apparatus of the type mentioned generally irradiates a laser beam onto the surface of a sample while the sample is moved so that the surface thereof is optically scanned to detect a foreign matter. If a foreign matter is detected on the surface of the sample by the optical scanning, then the position of the foreign matter on the surface of the sample is recorded as data.

The sample from which the foreign matter is detected in this manner is moved, when necessary, from the surface inspection apparatus to a separate foreign matter analyzer, by which the composition of the foreign matter is analyzed based on the position data.

In the analysis of the composition by the foreign matter analyzer, for example, the sample is placed into the inside of a vacuum vessel which is then evacuated. Then, a charged particle beam such as an electron beam or an ion beam is irradiated at the position of the foreign matter of the sample, and a secondary electron beam and/or a reflected electron beam and secondary ions generated as a result of the irradiation are detected.

If a result of the analysis reveals that the foreign matter will be an obstacle to operation of an electronic circuit, then the sample is moved from the foreign matter analyzer to a separate foreign matter removal apparatus, by which the foreign matter is removed based on the position data.

Such removal of the foreign matter by the foreign matter removal apparatus is performed, for example, by irradiating a laser beam to evaporate the foreign matter.

Since a fine foreign matter sticking to the surface of a sample can be detected and removed if a surface inspection apparatus, a foreign matter analyzer and a foreign matter removal apparatus are used as described above, this can contribute to production of, for example, an electronic circuit which will not suffer from an obstacle to its operation thereof.

However, such successive movements of a sample to different apparatus as described above complicate the operation and lowers the productivity of electronic circuits.

Further, installation of such various apparatus as mentioned above disadvantageously increases the area occupying by the equipment.

Furthermore, when a foreign matter is processed by the foreign matter analyzer or the foreign matter removal apparatus based on position data detected by the surface inspection apparatus as described above, since the sample is moved between the different apparatus, there is the possibility that the position data and the actual position of the foreign matter may be displaced from each other.

SUMMARY OF THE INVENTION

It is an object of the present invention to provide a sample processing apparatus and method by which a fine foreign matter sticking to the surface of a sample can be not only detected but also analyzed and removed.

In a sample processing apparatus according to an aspect of the present invention, foreign matter detection means detects a fine foreign matter sticking to a surface of a sample. Whether or not it is required to remove the foreign matter is determined by requirement determination means based on various data registered in advance in data storage means. The foreign matter, whose removal has been determined to be required is removed from the surface of the sample by foreign matter removal means.

Accordingly, in the sample processing apparatus of the present invention, detection of a foreign matter from the surface of a sample and removal of the detected foreign matter can be performed by a single sample processing apparatus.

Consequently, the foreign matter on the sample can be removed rapidly, and also the area occupied by the equipment can be reduced. Besides, since whether or not the detected foreign matter should be removed is automatically determined and only the foreign matter whose removal has been determined to be required is automatically processed, no manual operation is required for the operations.

It is to be noted that the sample in the present invention allows, for example, a semiconductor wafer, a glass substrate, and so forth.

Further in the present invition, only the means that are required to realize the various functions are provided, and a computer is used to which appropriate functions are provided by a program, or functions are realized in the inside of a computer by an appropriate program.

For example, the data storage means are required only to have various necessary data registered in advance therein and an information storage medium such as a RAM (Random Access Memory) or a ROM (Read Only Memory) is provided.

In a sample processing apparatus according to another aspect of the present invention, if a fine foreign matter sticking to a surface of a sample is detected by foreign matter detection means, then a composition of the foreign matter thus detected is analyzed by composition analysis means. Then, whether or not it is required to remove the foreign matter is determined by requirement determination means based on a result of the analysis and various data registered in advance in data storage means. The foreign matter, whose removal has been determined to be required, is removed from the surface of the sample by foreign matter removal means.

Accordingly, in the sample processing apparatus of the present invention, detection of a foreign matter from the surface of a sample, analysis of the composition of the detected foreign matter and removal of the foreign matter can be performed by the single sample processing apparatus.

Consequently, the foreign matter on the sample can be removed rapidly, and also the area occupied by the equipment can be reduced. Besides, since whether or not the detected foreign matter should be removed is automatically determined and only the foreign matter whose removal has been determined to be required is automatically processed, no manual operation is required for the operations.

In the sample processing apparatus described above, the foreign matter detection means may scan the surface of the sample with a beam of light to detect a foreign matter.

In this instance, since the entire area of the surface of the sample is scanned with the beam of light, a fine matter sticking to the surface of the sample can be detected at high speed in a non-contacting condition.

Further, in the sample processing apparatus, evacuation means for evacuating a position at which the sample is disposed may be provided additionally and the composition analysis means may irradiate a charged particle beam on the surface of the sample to analyze the composition of the foreign matter.

In this instance, the composition of the foreign matter detected on the surface of the sample can be analyzed at high speed in a non-contacting condition.

Further, 1he sample processing apparatus described above may be constructed so that it further comprises evacuation means for evacuating the position at which the sample is disposed, provides that the foreign matter detection means scans the surface of the sample with a beam of light to detect a foreign matter, provides that the composition analysis means irradiates a charged particle beam onto the surface of the sample to analyze a composition of the foreign matter, and ensure that the position of the sample at which the foreign matter detection means irradiates the beam of light is the same as the position at which the composition analysis means irradiates the charged particle beam.

In this instance, a fine foreign matter sticking to the surface of the sample is detected at high speed in a non-contacting condition by the foreign matter detection means. The composition of the foreign matter on the surface of the sample is detected at high speed in a non-contacting condition by the composition analysis means. Then, the beam of light for detection of a foreign matter and the charged particle beam for composition analysis are irradiated on the same position on the surface of the sample.

Accordingly, since detection and analysis of a foreign matter can be performed at the same position on the surface of the sample, the foreign matter can be analyzed without recording a detected position of the foreign matter as data.

The sample processing apparatus described above may be constructed so that it further comprises evacuation means for evacuating the position at which the sample is disposed, foreign matter detection means which scans the surface of the sample with a beam of light to detect a foreign matter, composition analysis means which irradiates a charged particle beam onto the surface of the sample to analyze a composition of the foreign matter, and provides that the position of the sample at which the foreign matter detection means irradiates the beam of light is different from the position at which the composition analysis means irradiates the charged particle beam.

In this instance, a fine foreign matter sticking to the surface of the sample is detected at high speed in a non-contacting condition by the foreign matter detection means. The composition of the foreign matter on the surface of the sample is detected at high speed in a non-contacting condition by the composition analysis means. Then, the beam of light for detection of a foreign matter and the charged particle beam for composition analysis are irradiated on these positions on the surface of the sample.

Accordingly, since detection and analysis of a foreign matter can be performed at different positions on the surface of the sample, optical systems for detection and analysis of a foreign matter can be disposed closely to the surface of the sample to augment the resolutions.

Further, in the sample processing apparatus described above, the foreign matter removal means may irradiate a beam of light on the foreign matter on the surface of the sample to evaporate the foreign matter.

In this instance, by irradiating the beam of light, the foreign matter can be evaporated and removed without destroying the sample.

Further, in the sample processing apparatus described above, the foreign matter removal means may emit a beam of light having an intensity at which the foreign matter is evaporated but the sample is not destroyed by the beam of light.

In this instance, by irradiating the beam of light, the foreign matter can be evaporated and removed without destroying the sample.

It is to be noted that the intensity of a beam of light in the present invention signifies an intensity on the surface of a sample on which the beam of light is irradiated and is adjusted by adjustment of, for example, the brightness of the beam of light, the irradiation time of the beam of light, the number of times that the beam of light is irradiated as pulses in a unit time, or the like.

Further, in the sample processing apparatus described above, the foreign matter removal means may irradiate a beam of light on the foreign matter on the surface of the sample to eliminate the foreign matter.

In this instance, the foreign matter on the surface of the sample can be eliminated and removed by irradiation of a beam of light. The mechanism of the elimination will be hereinafter described in detail.

Further, in the sample processing apparatus described above, the foreign matter removal means may irradiate a beam of light on the foreign matter on the surface of the sample to eliminate the foreign matter in multistages.

In this instance, a beam of light can be irradiated on the foreign matter on the surface of the sample to eliminate the foreign matter in multistages from the surface of the sample. It is to be noted that the multistage elimination is a technique of eliminating ionic bonds in a plurality of stages using a beam of light having high energy such as synchrotron radiation light, and will be hereinafter described in detail.

Further, in the sample processing apparatus described above, the foreign matter removal means may emit a beam of light having an intensity at which the bond between the foreign matter and the sample is destroyed but the sample is not destroyed by the beam of light.

In this instance, by irradiating the beam of light, the foreign matter can be eliminated and removed without destroying the sample.

Further, the sample processing apparatus described above, may further comprise gas supply means for supplying inert gas to the position of the foreign matter on the surface of the sample.

In this instance, the foreign matter on the surface of the sample is removed from the surface of the sample by irradiation of the beam of light, and the thus removed foreign matter is exhausted together with the inert gas. Since the inert gas does not react with the sample, the sample is not contacted by the gas supplied.

Accordingly, the foreign matter removed from the sample can be removed well together with the inert gas. Further, the removed foreign matter can be prevented from sticking to the sample again, and the sample can be prevented also from being contaminated by the gas.

It is to be noted that such inert gas as described above may be any gas which does not react with a sample and does not induce a photocatalytic effect. Nitrogen and argon, for example are allowed.

Alternatively, the sample processing apparatus may further comprise gas supply means for supplying active gas to the position of the foreign matter on the surface of the sample.

In this instance, the foreign matter on the surface of the sample is eliminated from the surface of the sample by irradiation of the beam of light, and the thus eliminated foreign matter is exhausted together with the active gas. Accordingly, the foreign matter removed from the sample can be removed well together with the active gas, and the removed foreign matter can be prevented fro:m sticking to the sample again.

Besides, since the active gas induces a photocatalytic effect, it can promote the elimination of the foreign matter.

Further, in the sample processing apparatus described above, the foreign matter removal means may converge the beam of light to a spot to irradiate the beam of light upon a spot-like foreign matter.

In this instance, when a fine foreign matter sticks to the surface of the sample, the beam of light converged to one spot is irradiated upon the spot-like foreign matter. Accordingly, the spot-like foreign matter can be removed well by the beam of light converged to one spot.

Alternatively, in the sample processing apparatus described above, the foreign matter removal means may converge the beam of light to a predetermined range to irradiate the beam of light upon an overall area of a planar foreign matter.

In this instance, if a foreign matter sticks to a fixed range of the surface of the sample, then the converged beam of light is irradiated upon the entire planar foreign matter. Accordingly, the planar foreign matter can be removed well by the beam of light converged to the predetermined range.

Further, the sample processing apparatus described above may be constructed such that the sample is a circuit board, and the data storage means has registered in advance therein various data which correspond to foreign matters which are obstacles to operation of an electric circuit while the requirement determination means determines that it is required to remove a foreign matter would be an obstacle to operation of an electric circuit.

In this instance, a foreign matter on the surface of a sample circuit board is removed when it would be an obstacle to operation of the electronic circuit. Accordingly, since any foreign matter which would be an obstacle to operation of an electronic circuit can be removed from the surface of a sample circuit board, an electronic circuit with no obstacle to its operation can be produced.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
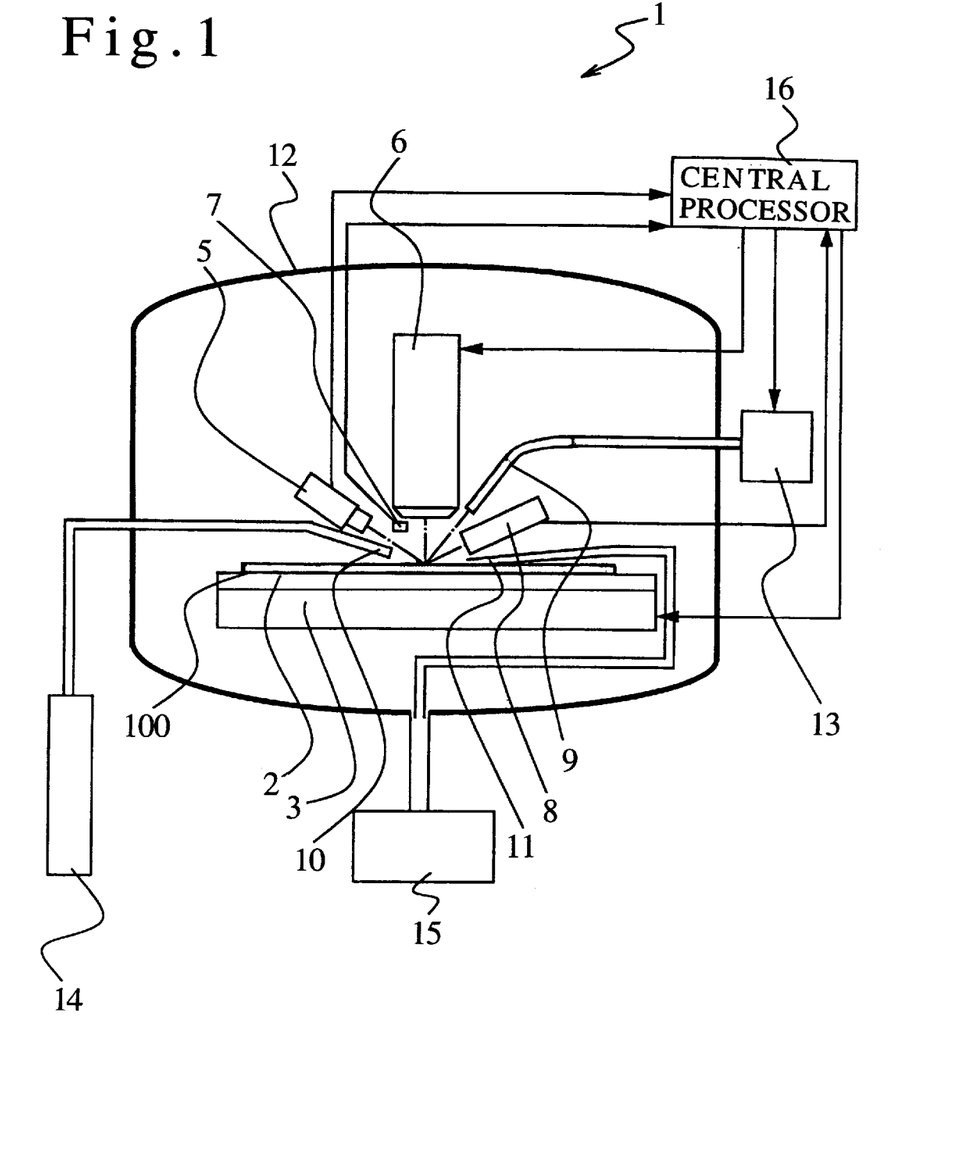
FIG. 1 is a schematic vertical sectional side elevational view showing an internal structure of a sample processing apparatus of a first embodiment of the present invention.
Figure 2:
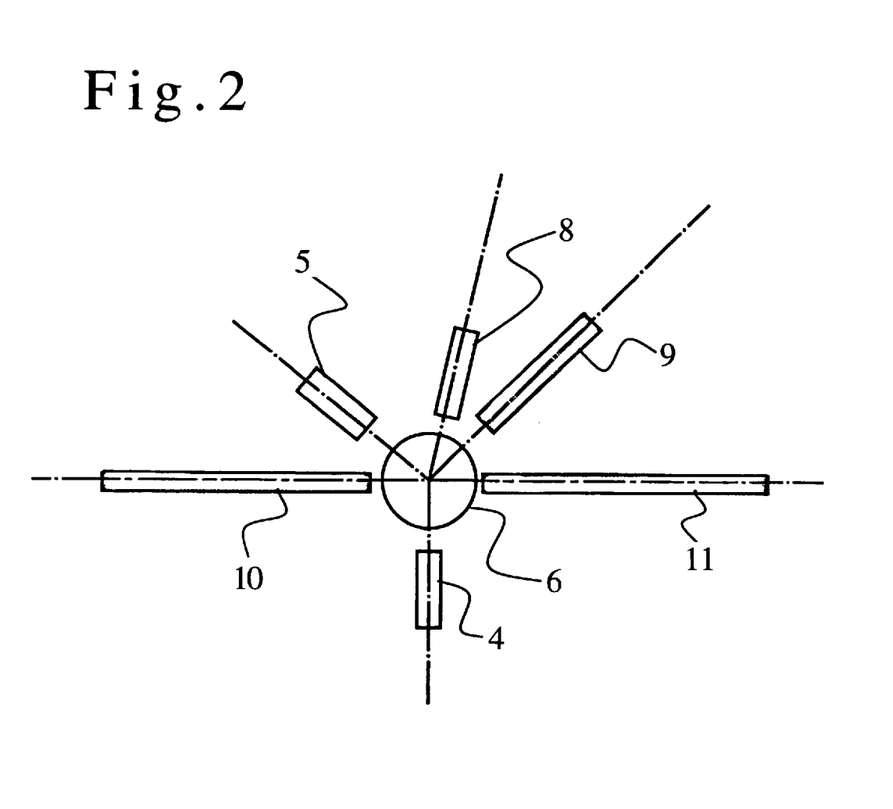
FIG. 2 is a plan view showing essential part of the sample processing apparatus.
Figure 3:
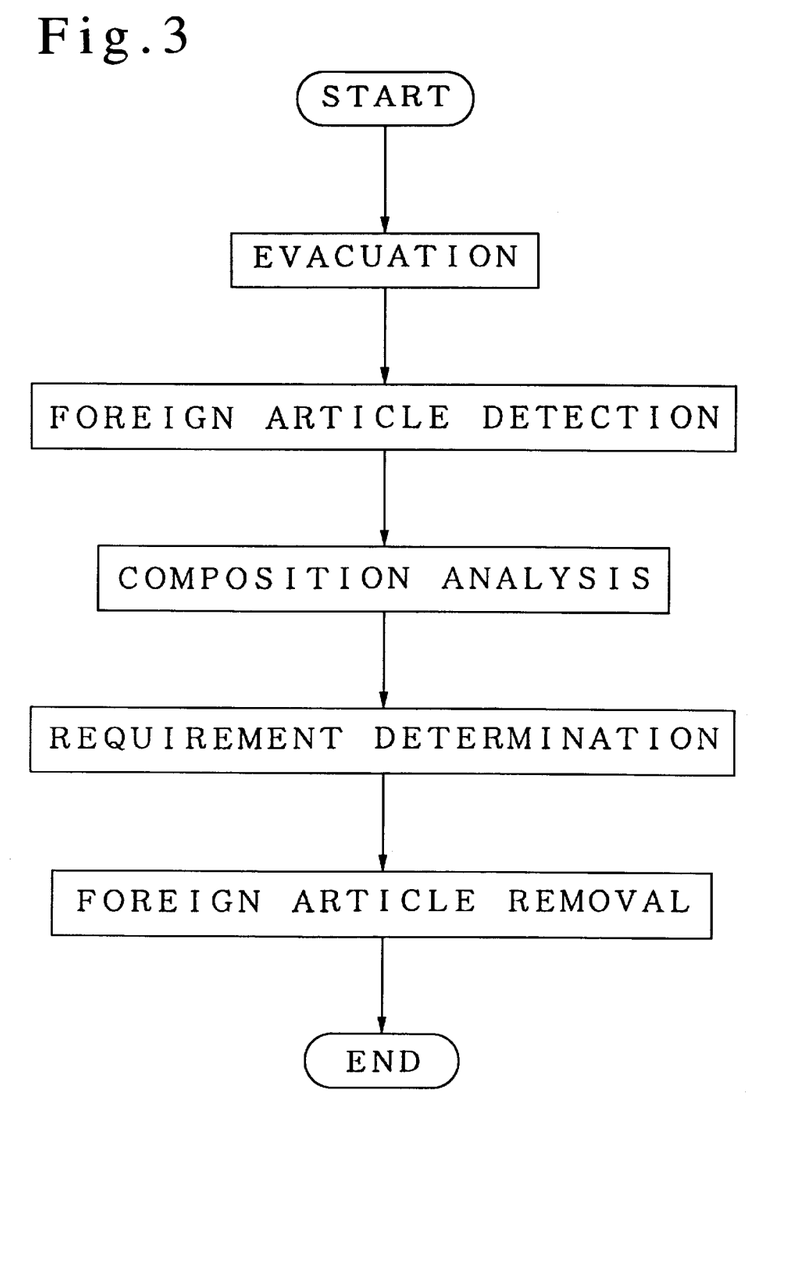
FIG. 3 is a flowchart showing a sample processing method.

An embodiment of the present invention is described below with reference to FIGS. 1 to 3.

Sample processing apparatus 1 of the present embodiment includes holding stage 2 as a sample holding mechanism for holding circuit board 100 which is determined as a sample. Holding stage 2 is supported for movement in X-Y directions by relative scanning mechanism 3.

Relative scanning mechanism 3 is formed such that, for example, a plunger mechanism which can be moved in the X direction is connected to an apparatus body and another plunger mechanism which can be moved in the Y direction is connected to the first-mentioned plunger mechanism and supports holding stage 2 thereon.

At positions opposing the surface of circuit board 100 held by holding stage 2 in this manner, laser irradiator 4, optical detector 5, electron irradiator 6, electron detector 7, X-ray detector 8, photon irradiation optical system 9, gas injection nozzle 10 and gas exhaust nozzle 11 are disposed.

The elements mentioned are arranged in the inside of vacuum vessel 12 together with holding stage 2 and relative scanning mechanism 3. Outside vacuum vessel 12, photon outputting apparatus 13, gas generator 14, gas exhaust apparatus 15 and central processor 16 are disposed.

Central processor 16 is formed from a computer system and includes a CPU (Central Processing Unit) as a computer.

Various devices such as a ROM, a RAM which serves as data storage means and an I/F (interface) are connected to the CPU.

An appropriate program is stored in the ROM in advance. The RAM has a storage area necessary for various data processes secured therein.

Central processor 16 realizes various functions by appropriate data processes executed by the CPU in accordance with the program of the ROM.

Laser irradiator 4 includes a laser source and an imaging optical system (not shown) and irradiates a laser beam converged to a spot upon the surface of circuit board 100.

Optical detector 5 includes an imaging optical system and a light detector (not shown) and detects a laser beam reflected irregularly by the surface of circuit board 100.

Apparatus 4 and 5 are connected to central processor 16. Central processor 16 detects a fine foreign matter sticking to the surface of circuit board 100 from an output signal of optical detector 5.

Accordingly, a foreign matter detection function is realized by apparatus 4, 5 and 12.

Electron irradiator 6 irradiates an electron beam, which is a charged particle beam, on the surface of circuit board 100.

Electron detector 7 detects secondary electrons and/or reflected electrons generated at the surface of circuit board 100 as a result of irradiation of the electron beam. X-ray detector 8 detects a characteristic X-ray, Auger electrons, secondary electrons and secondary ions which are generated at the surface of circuit board 100 as a result of irradiation of the electron beam.

Also electron detector 7 is connected to central processor 16. Central processor 16 inspects the foreign matter on the surface of circuit board 100 detected from the output signal of optical detector 5 more finely based on an output of electron detector 7.

Accordingly, a second foreign matter detection apparatus is realized by apparatus 6, 7 and 16.

Also X-ray detector 8 is connected to central processor 16. Central processor 16 analyzes the composition of the foreign matter on the surface of circuit board 100 from an output signal of X-ray detector 8.

Accordingly, a composition analysis function is realized by apparatus 6, 8 and 12.

In the RAM of central processor 16, various data regarding whether or not it is required to remove a foreign matter are registered in advance for various foreign matters which may be an obstacle to operation of an electronic circuit to be produced on circuit board 100.

Central processor 16 realizes a requirement determination function by an appropriate data process executed by the CPU in accordance with the program of the ROM.

The requirement determination function of central processor 16 compares a result of the analysis of the composition of a foreign matter detected from circuit board 100 with the storage data of the RAM regarding whether it is required to remove the foreign matter, and if it determines that the foreign matter will be an obstacle to operation of the electronic circuit, then it determines that removal of the foreign matter is required.

Photon outputting apparatus 13 is connected to photon irradiation optical system 9.

Photon irradiation optical system 9 converges photons outputted from an excimer laser built in photon outputting apparatus 13 so as to be irradiated as a beam of light having a high energy and a uniform wavelength on a point on the surface of circuit board 100.

Also photon outputting apparatus 13 is connected to central processor 16. Central processor 16 controls operation of photon outputting apparatus 13.

As central processor 16 controls operation of photon outputting apparatus 13, photons are irradiated upon the foreign matter on the surface of circuit board 100 to evaporate (ablation) and remove the foreign matter.

Accordingly, a foreign matter removal function is realized by apparatus 13 and 16.

It is to be noted that central processor 16 adjusts the photons outputted from photon outputting apparatus 13 to such an intensity that, while the foreign matter is evaporated by the photons, circuit board 100 is not destroyed.

Such adjustment in intensity is performed by adjustment of, for example, the output intensity of photons in a unit time, the irradiation time of photons or the number of times that photons are outputted as pulses in a unit time.

It is to be noted that apparatus 4, 6 and 9 are arranged so that the laser beam of laser irradiator 4, the electron beam of electron irradiator 6 and the photons of photon irradiation optical system 9 may be irradiated on a common point on the surface of circuit board 100 held by holding stage 2.

Also relative scanning mechanism 3 is connected to central processor 16. Central processor 16 controls operation of relative scanning mechanism 3. Accordingly, the surface of circuit board 100 is scanned relative to apparatus 4, 6 and 9.

Gas generator 14 is connected to gas injection nozzle 10. Here, a gas supplying function is realized since inert gas such as nitrogen generated by gas generator 14 is supplied to the surface of circuit board 100 by gas injection nozzle 10.

Gas exhaust apparatus 15 is connected to gas exhaust nozzle 11. Here, an evacuation function is realized since gas exhaust apparatus 15 effects forced exhaust to render the inside of vacuum vessel 12 vacuum.

A sample processing method by sample processing apparatus 1 of the present embodiment having such a construction as described above is described below.

First, circuit board 100 which is an object of inspection is placed onto holding stage 2 in the inside of vacuum vessel 12. Then, gas exhaust apparatus 15 is driven to evacuate the inside of vacuum vessel 12.

In this state, a laser beam is converged into a spot by laser irradiator 4 and irradiated upon the surface of circuit board 100, and the laser light reflected irregularly by the surface of circuit board 100 is detected by optical detector 5.

In this instance, central processor 16 controls operation of relative scanning mechanism 3 to successively move circuit board 100 in the X-Y directions, and processes an output signal of optical detector 5 as data to inspect whether or not there is a fine foreign matter on the surface of circuit board 100.

If the inspection reveals a foreign matter sticking to the surface of circuit board 100, then central processor 16 renders electron irradiator 6 and electron detector 7 operative so that they function as an electronic microscope to inspect the foreign matter on the surface of circuit board 100 in an enlarged scale.

If it is confirmed by the inspection that a foreign matter is present on the surface of circuit board 100, then central processor 16 renders electron irradiator 6 and X-ray detector 8 operative.

In short, central processor 16 controls electron irradiator 6 to irradiate the electron beam at the position of the foreign matter on the surface of circuit board 100 and controls X-ray detector 8 to detect a characteristic X-ray generated as a result of the irradiation of the electron beam.

Central processor 16 processes an output signal of X-ray detector 8 as data to analyze the component of the foreign matter on the surface of circuit board 100 in terms of elements.

Then, central processor 16 compares a result of the analysis of the composition of the foreign matter with the various data registered in advance therein to determine whether or not the foreign matter on circuit board 100 will be an obstacle to operation of an electronic circuit to be produced.

Here, if it is determined that the foreign matter on circuit board 100 will not be an obstacle to operation of the electronic circuit, then it is determined that no removing operation for the foreign matter is required and the operation is resumed.

However, if it is determined that the foreign matter will be an obstacle to the operation, then it is determined that it is required to remove the foreign matter, and the operation therefor is started.

In this instance, central processor 16 drives photon outputting apparatus 13 so that photon outputting apparatus 13 irradiates photons at the position of the foreign matter an the surface of circuit board 100 using photon irradiation optical system 9.

Accordingly, the foreign matter on the surface of circuit board 100 is evaporated (ablation) and removed by the irradiated photons.

In this instance, central processor 16 adjusts the output power of photon outputting apparatus 13 to such an intensity that, while the foreign matter is evaporated by the photons, circuit board 100 is not destroyed by the photons.

Further, when the foreign matter on the surface of circuit board 100 is evaporated by irradiation of photons as described above, the surface of circuit board 100 is evacuated by gas exhaust nozzle 11 connected to gas exhaust apparatus 15 while inert gas generated by gas generator 14 is supplied to the surface of circuit board 100 through gas injection nozzle 10 so that the evaporated gas of the foreign matter is evacuated from the surface of circuit board 100 together with the inert gas which flows in a laminar flow.

Sample processing apparatus 1 of the present embodiment performs detection of a foreign matter on the surface of circuit board 100, analysis of the composition of the detected foreign matter and removal of the foreign matter based on a result of the analysis by the single apparatus as described above.

Consequently, sample processing apparatus 1 can remove a foreign matter on circuit board 100 rapidly to augment the productivity of an electronic circuit and has a reduced equipment occupation area.

Particularly, sample processing apparatus 1 automatically determines, from a result of analysis of the composition of a detected foreign matter, whether the foreign matter will be an obstacle to operation of an electronic circuit by comparison with the various data set in advance, and automatically removes only a foreign matter which will be an obstacle to operation.

Accordingly, only a foreign matter required to be removed can be processed automatically without a manual operation.

Further, in sample processing apparatus 1 of the present embodiment, when a foreign matter on the surface of circuit board 100 is removed by photons outputted from photon outputting apparatus 13 and forming a beam of light, the photons are converged to a spot by photon irradiation optical system 9 and irradiated upon the surface of circuit board 100, the spot-like fine foreign matter can be removed well.

Besides, since photons outputted from photon outputting apparatus 13 in this manner are adjusted by central processor 16 to such an intensity that, although the foreign matter is evaporated by the photons, circuit board 100 is not destroyed by the photons, only the foreign matter will be removed without destroying circuit board 100.

Further, when a foreign matter on the surface of circuit board 100 is evaporated by irradiation of photons in this manner, inert gas is supplied while the surface of circuit board 100 is being evacuated. Consequently, evaporated gas of the foreign matter can be evacuated from the surface of circuit board 100 together with the inert gas which flows in a laminar flow, and the evaporated gas of the foreign matter can be prevented from sticking to the surface of circuit board 100 again.

Particularly since the gas supplied to the surface of circuit board 100 in this manner is inert gas, the gas does not react with or contaminate circuit board 100.

Furthermore, in sample processing apparatus 1 of the present embodiment, the laser beam of laser irradiator 4, the electron beam of electron irradiator 6 and the photons of photon irradiation optical system 9 are irradiated at a common point on the surface of circuit board 100 held by holding stage 2.

Accordingly, detection, analysis and removal of a foreign matter can be performed at the one point on the surface of circuit board 100.

Consequently, it is not necessary to record a detection position of a foreign matter as data and perform analysis or removal of the foreign matter based on the data, and analysis and removal of the foreign matter can be performed with certainty without taking care of possible displacement of the foreign matter.

It is to be noted that it is described in the embodiment that, in order to analyze a foreign matter on the surface of circuit board 100, an electron beam is irradiated as a charged particle beam from electron irradiator 6.

However, it is otherwise possible to irradiate an ion beam as a charged particle beam using an ion irradiation apparatus (not shown).

Further, it is described in the embodiment that, in order to analyze a foreign matter on the surface of circuit board 100, a characteristic X-ray which is generated by irradiation of such a charged particle beam as described above is detected by X-ray detector 8.

However, it is otherwise possible to use, in place of X-ray detector 8, an energy detection apparatus (not shown) by which a foreign matter on circuit board 100 is analyzed by energy detection.

Furthermore, it is described in the embodiment that, in order to effect relative scanning between laser irradiator 4, electron irradiator 6 or photon irradiation optical system 9 and the surface of circuit board 100, holding stage 2 by which circuit board 100 is held is moved by relative scanning mechanism 3.

However, it is otherwise possible to move laser irradiator 4 to effect scanning while circuit board 100 is kept stationary or to move circuit board 100 in one of the X-Y directions while laser irradiator 4 is moved in the other of the X-Y directions.

Further, it is described in sample processing apparatus 1 of the embodiment that apparatus 4 and 5 for detection of a foreign matter, apparatus 6 and 8 for analysis, apparatus 9 for removal and so forth are opposed to the same one point on the surface of circuit board 100 so that analysis and removal of a foreign matter can be performed with certainty without requiring to record data of a detection position of the foreign matter.

Figure 4:
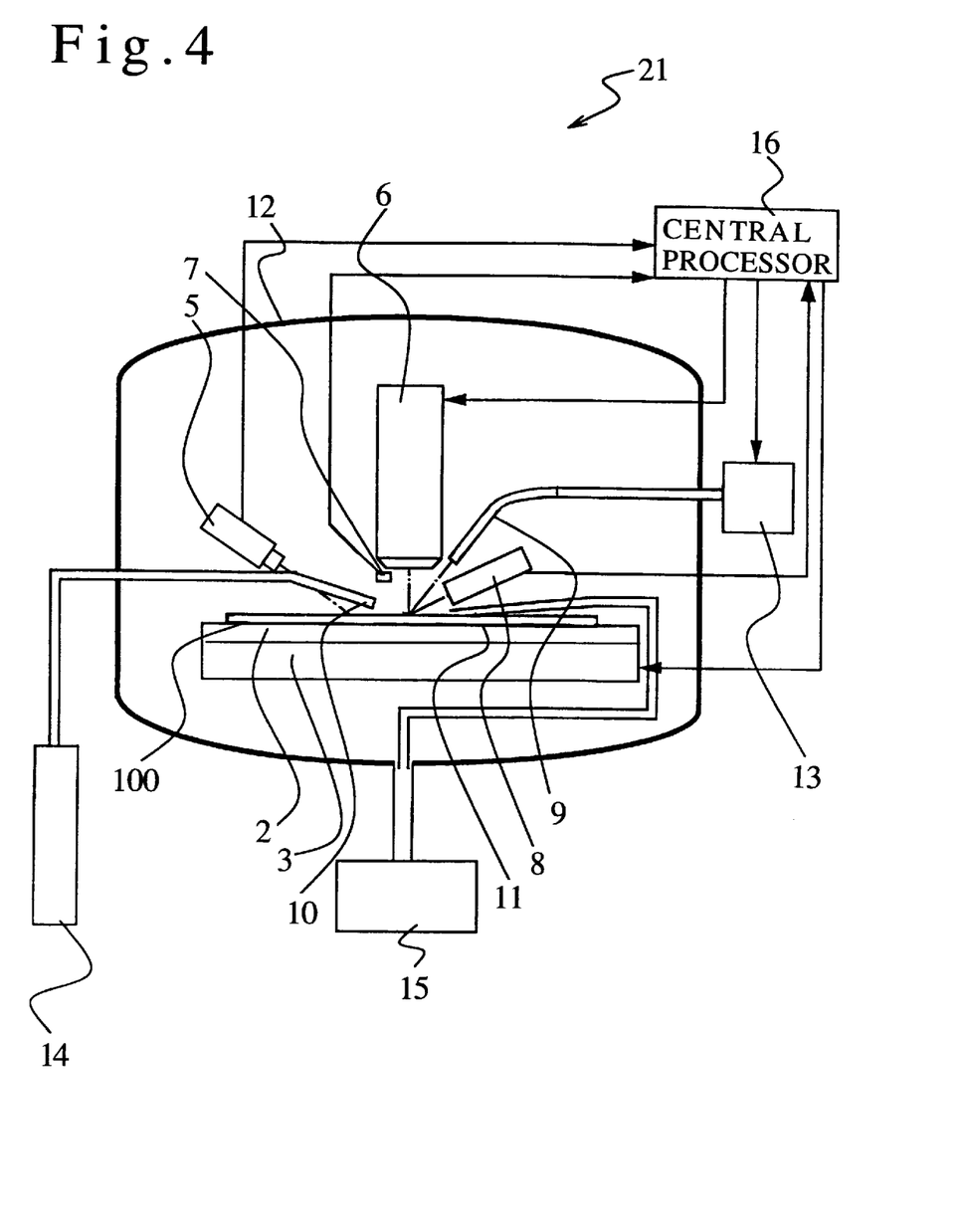
FIG. 4 is a schematic vertical sectional side elevational view showing an internal structure of a sample processing apparatus of a modified form.

However, it is otherwise possible to oppose apparatus 4 and 5 for detection of a foreign matter to the surface of circuit board 100 at a position different from that of apparatus 6 and 8 for analysis of a foreign matter as in sample processing apparatus 21 shown in FIG. 4.

In this instance, the two different optical systems need not be arranged in a concentrated manner at one place. Accordingly, the optical systems can be disposed close to circuit board 100 to assure higher resolutions, and original functions of the individual optical systems can be exhibited to augment the basic functions of sample processing apparatus 21.

It is to be noted that, in regard to two sample processing apparatus 1, 21 described above, while sample processing apparatus 1 described above can be controlled simply because a detection position of a foreign matter need not be recorded as data, it is difficult to augment the resolutions of the optical systems for detection and for analysis of a foreign matter, and sample processing apparatus 21 has an advantage and a disadvantage reverse to those of sample processing apparatus 1.

In short, since sample processing apparatus 1, 21 have both merits and demerits, actually they are preferably selectively used taking required performances and so forth into consideration.

Further, it is described in the embodiment that a foreign matter on the surface of circuit board 100 is evaporated to remove it by irradiation of photons which form a beam.

However, it is otherwise possible to eliminate and remove a foreign matter on the surface of circuit board 100 by irradiating a beam of light.

A mechanism of light-excited elimination free from a volatile reaction by irradiation of a beam of light is described in "Study of Semiconductors 26", VLSI Technology 11, the Industrial Research Society of Japan, pp.168.

Figure 5:
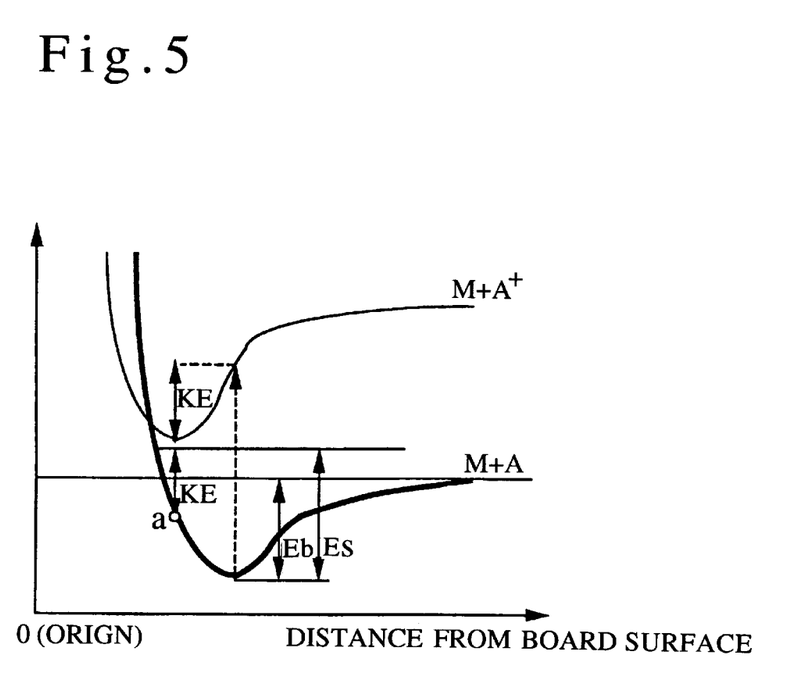
FIG. 5 is a characteristic diagram illustrating potential energy for explaining light-excited elimination free from a volatile reaction.

The mechanism just mentioned is described below with reference to FIG. 5.

First, in a ground state M (substrate)+ A (adsorbed species) prior to light excitation, the distance between the foreign matter and the atoms of the substrate is approximated by the sum of the radii of the atoms.

If it is assumed that the foreign matter is ionized to the positive by light excitation (or by a light excitation interaction with the substrate), then the radii of the ions are smaller than those of the neutral atoms. Therefore, the potential curve (comparatively thin curve in FIG. 5) has its lowest value nearer to the origin than that of the potential curve (comparatively thick curve in FIG. 5) of the neutral atoms.

Accordingly, since the ions move to the substrate side and acquire kinetic energy (KE), the tunnel probability of electrons from the substrate to ions increases and the electrons tunnel, whereupon the ions are neutralized again, thereby returning to the original potential curve of the ground state.

In this instance, since the position of the foreign matter is nearer to the substrate than the preceding stable position, it is in a repulsive region of the potential curve.

If Es which is the sum of the new potential energy and the kinetic energy (KE) is higher than bond energy Eb between the foreign matter and the substrate, then the foreign matter is eliminated from the surface of the substrate.

In other words, the wavelength and the light amount of light to be irradiated should be selected so that overall energy Es by light excitation may become higher than bond energy Eb between the foreign matter and the substrate thereby to allow elimination of the foreign matter.

It is to be noted that, also when a foreign matter is eliminated from circuit board 100 by irradiation of a beam of light as described above, inert gas is preferably supplied toward circuit board 100 to remove the eliminated foreign matter from the surface of circuit board 100.

In this instance, while the light-excited elimination described above occurs in a condition free from a volatile reaction, it is otherwise possible to cause light-excited elimination with a volatile reaction to occur by supplying photocatalytic active gas to the surface of circuit board 100.

More particularly, photocatalytic active gas is supplied to the surface of circuit board 100 while a beam of light for eliminating a foreign matter is irradiated upon the surface of circuit board 100.

Consequently, the temperature of the gas becomes so high that the foreign matter is thermally dissociated from the surface of the substrate by oscillation excitation in a single potential of a ground state.

As the energy further increases, the foreign matter is excited to antibonding orbitals by electrons and dissociated as a result of repulsion to circuit board 100 (direct dissociation).

A foreign matter is eliminated from the circuit board 100 by such a mechanism as described above. The foreign matter eliminated in this manner is evacuated together with inert gas.

It is to be noted that the rate of the elimination is a function of the substrate temperature and has a tendency in which it increases as the substrate temperature rises.

It is also possible to use light of high energy (for example, synchrotron radiation light) to cause multistage elimination of a foreign matter from circuit board 100.

A KF (Knot-elk-Feibelman) model of the multistage elimination is described below with reference to FIGS. 5*a* to 5*c*.

Figure 6A:
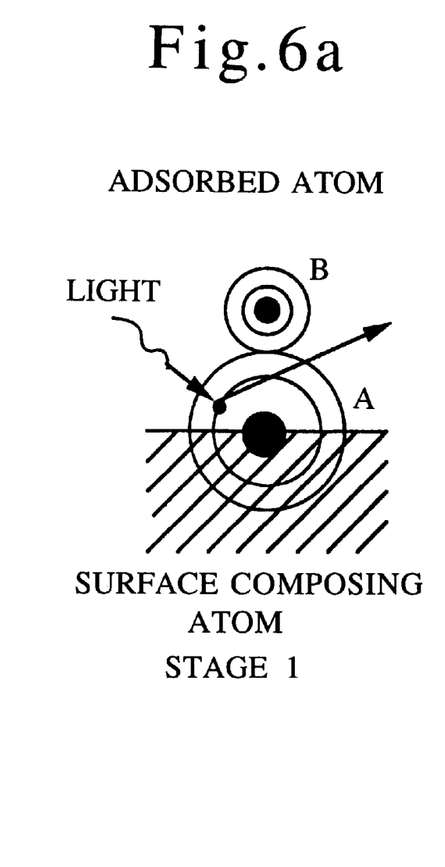
FIG. 6 is a schematic view showing a KF model for explaining multistage elimination.
Figure 6B:
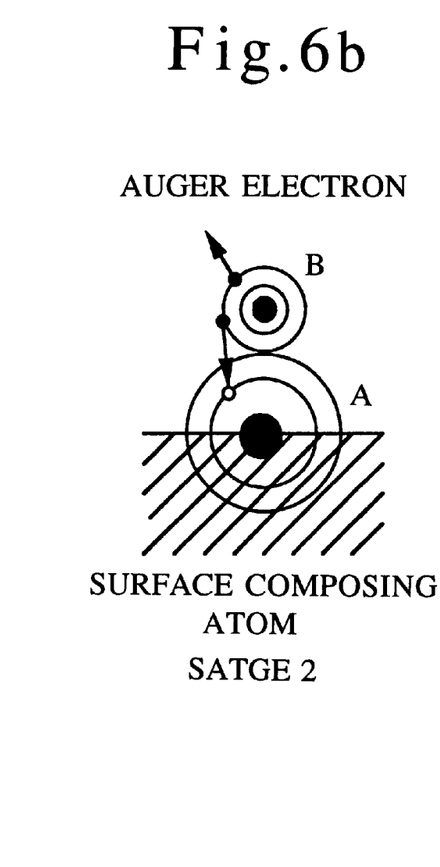

As seen in FIG. 6*a*, in the first stage, an inner-shell electron of the surface of the substrate (denoted by A) having positive charge is excited by a large number of electrons and/or photons. In the second stage, as seen in FIG. 6*b*, a hole produced as a result of removal of the electron is filled up with an electron of a component atom or an adsorbed atom (denoted by B) of negative charge which is in an excitation level (Auger relaxation).

Figure 6C:
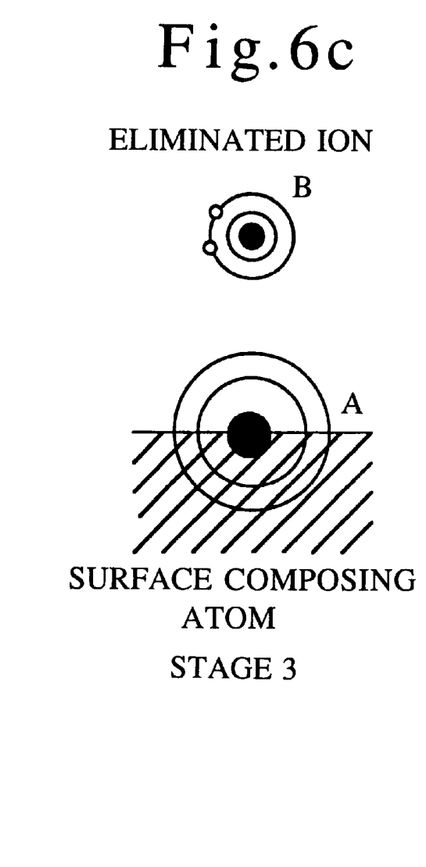

Then, in the third stage, as seen in FIG. 6*c*, a plurality of electrons are discharged from the B atom by energy obtained by the relaxation, whereupon holes are produced. Consequently, the B atom now exhibits positive charge, and the B ion is liberated from the A atom of positive charge by a Coulomb reaction therebetween.

The foreign matter is eliminated from circuit board 100 through the stages described above. Accordingly, the foreign matter eliminated in this manner should be removed together with inert gas or active gas.

Dry cleaning by light-excited etching in which an excimer laser is utilized is disclosed in Kiyoshi Takahashi, Hiroyuki Matsunami, Yoshimasa Murata and Mitsugu Hanabusa, "The foundation of a light-excited process", The Industrial Research Society of Japan, 1994. The dry cleaning has the following characteristics:

1) The dry cleaning essentially is a low temperature process and gives comparatively little damage to a substrate;
2) Compared with ion etching, the dry cleaning gives less damage to an electronic circuit on a substrate by contamination or ion bombardment;
3) The dry etching allows a chemical reaction for selective exfoliation by suitably selecting the laser wavelength and the atmosphere gas; and
4) When a foreign matter which has been determined as an obstacle on a substrate is to be removed, the dry etching exhibits a high spatial resolution because the focus is theoretically restricted approximately to the wavelength of the laser.

Further, it is described in the embodiment that photons which form a beam of light are converged to a spot to remove a spot-like foreign matter.

However, it is otherwise possible to converge a beam of light to a predetermined range to irradiate it over an overall area of a planar foreign matter so that the beam of light is irradiated at one time upon the entire foreign matter in a fixed range of the surface of circuit board 100 to remove the foreign matter of the wide range rapidly.

It is to be noted that naturally the various modifications may be combined in various combinations within a range within which the contents of them remain consistent, and, for example, a foreign matter can be eliminated from circuit board 100 using the structure illustrated in FIG. 4.

While preferred embodiments of the present invention have been described using specific terms, such description is for illustrative purpose only, and it is to be understood that changes and variations may be made without departing from the spirit or scope of the following claims.

What is claimed is:

1. A sample processing apparatus comprising:
    foreign matter detection means for detecting a fine foreign matter sticking to a surface of a sample;

data storage means in which various data regarding whether or not it is required to remove foreign matters are registered in advance;

requirement determination means for determining based on the storage data of said data storage means whether or not it is required to remove the foreign matter detected by said detection means; and foreign matter removal means for removing the foreign matter, whose removal has been determined to be required, from the surface of the sample, wherein the foreign matter detection means and the foreign matter removal means are configured to respectively detect and remove the foreign matter from the surface of the sample in a same vessel.

2. A sample processing apparatus as claimed in claim 1, wherein said foreign matter detection means includes means for scanning the surface of the sample with a beam of light to detect a foreign matter.

3. A sample processing apparatus as claimed in claim 1, wherein the sample is a circuit board, and said data storage means has registered in advance therein various data which correspond to foreign matters which would be obstacles to operation of an electric circuit while said requirement determination means includes means for determining that it is required to remove a foreign matter which would be an obstacle to operation of an electric circuit.

4. A sample processing apparatus as claimed in claim 1, wherein the sample is a circuit board, and said data storage means has registered in advance therein various data which correspond to foreign matters which would be an obstacle to operation of an electric circuit while said requirement determination means includes means for determining that it is required to remove a foreign matter which would be an obstacle to operation of an electric circuit.

5. A sample processing apparatus comprising:

foreign matter detection means for detecting a fine foreign matter sticking to a surface of a sample;

composition analysis means for analyzing the composition of the foreign matter detected by said foreign matter detection means;

data storage means in which various data regarding whether or not it is required to remove foreign matters are registered in advance;

requirement determination means for determining based on the storage data of said data storage means and a result of the analysis of said composition analysis means whether or not it is required to remove the foreign matter detected by said foreign matter detection means; and foreign matter removal means for removing the foreign matter, whose removal has been determined to be required, from the surface of the sample, wherein the foreign matter detection means and the foreign matter removal means are configured to respectively detect and remove the foreign matter from the surface of the sample in a same vessel.

6. A sample processing apparatus as claimed in claim 5, wherein said foreign matter detection means includes means for scanning the surface of the sample with a beam of light to detect a foreign matter.

7. A sample processing apparatus as claimed in claim 5, further comprising evacuation means for evacuating a position at which the sample is disposed, said composition analysis means including means for irradiating a charged particle beam on the surface of the sample to analyze the composition of the foreign matter.

8. A sample processing apparatus as claimed in claim 5, further comprising evacuation means for evacuating a position at which the sample is disposed, said foreign matter detection means including means for scanning the surface of the sample with a beam of light to detect a foreign matter, said composition analysis means including means for irradiating a charged particle beam onto the surface of the sample to analyze a composition of the foreign matter, a position of the sample at which said foreign matter detection means irradiates the beam of light being same as a position at which said composition analysis means irradiates the charged particle beam.

9. A sample processing apparatus as claimed in claim 8, wherein said foreign matter removal means includes means for irradiating a beam of light on the foreign matter on the surface of the sample to evaporate the foreign matter.

10. A sample processing apparatus as claimed in claim 9, wherein said foreign matter removal means includes means for emitting a beam of light having an intensity at which the foreign matter is evaporated but the sample is not destroyed by the beam of light.

11. A sample processing apparatus as claimed in claim 10, further comprising gas supply means for supplying inert gas to the position of the foreign matter on the surface of the sample.

12. A sample processing apparatus as claimed in claim 9, wherein said foreign matter removal means includes means for converging the beam of light to a spot to irradiate the beam of light upon a spot-like foreign matter.

13. A sample processing apparatus as claimed in claim 9, wherein said foreign matter removal means includes means for converging the beam of light to a predetermined range to irradiate the beam of light upon an overall area of a planar foreign matter.

14. A sample processing apparatus as claimed in claim 8, wherein said foreign matter removal means includes means for irradiating a beam of light on the foreign matter on the surface of the sample to eliminate the foreign matter.

15. A sample processing apparatus as claimed in claim 14, wherein said foreign matter removal means includes means for emitting a beam of light having an intensity at which the bond between the foreign matter and the sample is destroyed but the sample is not destroyed by the beam of light.

16. A sample processing apparatus as claimed in claim 14, further comprising gas supply means for supplying inert gas to the position of the foreign matter on the surface of the sample.

17. A sample processing apparatus as claimed in claim 14, further comprising gas supply means for supplying active gas to the position of the foreign matter on the surface of the sample.

18. A sample processing apparatus as claimed in claim 14, wherein said foreign matter removal means includes means for converging the beam of light to a spot to irradiate the beam of light upon a spot-like foreign matter.

19. A sample processing apparatus as claimed in claim 14, wherein said foreign matter removal means includes means for converging the beam of light to a predetermined range to irradiate the beam of light upon an overall area of a planar foreign matter.

20. A sample processing apparatus as claimed in claim 8, wherein said foreign matter removal means includes means for irradiating a beam of light on the foreign matter on the surface of the sample to multistage eliminate the foreign matter.

21. A sample processing apparatus as claimed in claim 20, wherein said foreign matter removal means includes means for emitting a beam of light having an intensity at which the bond between the foreign matter and the sample is destroyed but the sample is not destroyed by the beam of light.

22. A sample processing apparatus as claimed in claim 5, further comprising evacuation means for evacuating a position at which the sample is disposed, said foreign matter detection means including means for scanning the surface of the sample with a beam of light to detect a foreign matter, said composition analysis means including means for irradiating a charged particle beam onto the surface of the sample to analyze a composition of the foreign matter, a position of the sample at which said foreign matter detection means irradiates the beam of light being different from a position at which said composition analysis means irradiates the charged particle beam.

23. A sample processing apparatus as claimed in claim 22, wherein said foreign matter removal means includes means for irradiating a beam of light on the foreign matter on the surface of the sample to evaporate the foreign matter.

24. A sample processing apparatus as claimed in claim 23, wherein said foreign matter removal means includes means for emitting a beam of light having an intensity at which the foreign matter is evaporated but the sample is not destroyed by the beam of light.

25. A sample processing apparatus as claimed in claim 24, further comprising gas supply means for supplying inert gas to the position of the foreign matter on the surface of the sample.

26. A sample processing apparatus as claimed in claim 23, wherein said foreign matter removal means includes means for converging the beam of light to a spot to irradiate the beam of light upon a spot-like foreign matter.

27. A sample processing apparatus as claimed in claim 23, wherein said foreign matter removal means includes means for converging the beam of light to a predetermined range to irradiate the beam of light upon an overall area of a planar foreign matter.

28. A sample processing apparatus as claimed in claim 22, wherein said foreign matter removal means includes means for irradiating a beam of light on the foreign matter on the surface of the sample to eliminate the foreign matter.

29. A sample processing apparatus as claimed in claim 28, wherein said foreign matter removal means includes means for emitting a beam of light having an intensity at which the bond between the foreign matter and the sample is destroyed but the sample is not destroyed by the beam of light.

30. A sample processing apparatus as claimed in claim 28, further comprising gas supply means for supplying inert gas to the position of the foreign matter on the surface of the sample.

31. A sample processing apparatus as claimed in claim 28, further comprising gas supply means for supplying active gas to the position of the foreign matter on the surface of the sample.

32. A sample processing apparatus as claimed in claim 28, wherein said foreign matter removal means includes means for converging the beam of light to a spot to irradiate the beam of light upon a spot-like foreign matter.

33. A sample processing apparatus as claimed in claim 28, wherein said foreign matter removal means includes means for converging the beam of light to a predetermined range to irradiate the beam of light upon an overall area of a planar foreign matter.

34. A sample processing apparatus as claimed in claim 22, wherein said foreign matter removal means includes means for irradiating a beam of light on the foreign matter on the surface of the sample to multistage eliminate the foreign matter.

35. A sample processing apparatus as claimed in claim 34, wherein said foreign matter removal means includes means for emitting a beam of light having an intensity at which the bond between the foreign matter and the sample is destroyed but the sample is not destroyed by the beam of light.

36. A sample processing method comprising:
    a foreign matter detection step of detecting a fine foreign matter sticking to a surface of a sample;
    a requirement determination step of determining based on various data registered in advance whether or not it is required to remove the foreign matter detected by the foreign matter detection step; and
    a foreign matter removal step of removing the foreign matter, whose removal has been determined to be required by the requirement determination step, from the surface of the sample,
    wherein the foreign matter detection step the foreign matter removal step are performed in a same vessel.

37. A sample processing method comprising:
    a foreign matter detection step of detecting a fine foreign matter sticking to a surface of a sample;
    a composition analysis step of analyzing the composition of the foreign matter detected by the foreign matter detection step;
    a requirement determination step of determining based on a result of the analysis of the composition analysis step and various data registered in advance whether or not it is required to remove the foreign matter; and
    a foreign matter removal step of removing the foreign matter, whose removal has been determined to be required by the requirement determination step, from the surface of the sample,
    wherein the foreign matter detection step and the foreign matter removal step are performed in a same vessel.

38. A samples processing method comprising:
    an evacuation step of evacuating a position at which a sample is disposed;
    a foreign mater detection step of scanning a surface of the sample with a beam of light to detect a fine foreign matter;
    a composition analysis step of irradiating a charged particle beam on the surface of the sample to analyze a composition of the foreign matter;
    a requirement determination step of determining based on a result of the analysis of the composition analysis step and various data registered in advance whether or not it is required to remove the foreign matter; and
    a foreign matter removal step of removing the foreign matter, whose removal has been determined to be required by the requirement determination step, from the surface of the sample,
    wherein the foreign matter detection step and the foreign matter removal step are performed in a same vessel.

* * * * *